United States Patent [19]

Josquin et al.

[11] Patent Number: 5,023,192

[45] Date of Patent: Jun. 11, 1991

[54] METHOD OF MANUFACTURING A BIPOLAR TRANSISTOR

[75] Inventors: Wilhelmus J. Josquin; Jan Van Dijk, both of Eindhoven, Netherlands

[73] Assignee: U.S. Philips Corporation, New York, N.Y.

[21] Appl. No.: 582,298

[22] Filed: Sep. 13, 1990

[30] Foreign Application Priority Data

Sep. 20, 1989 [GB] United Kingdom ............... 8921262

[51] Int. Cl.$^5$ .......................................... H01L 21/328
[52] U.S. Cl. ...................................... 437/31; 437/28; 437/112; 437/228; 437/978; 357/34; 148/DIG. 43
[58] Field of Search ............... 437/27, 28, 31, 32, 437/33, 149, 150, 153, 154, 162, 228, 233, 238, 947, 958, 967, 978; 148/DIG. 11, DIG. 43, DIG. 111, DIG. 123, DIG. 145, DIG. 157; 357/34

[56] References Cited

U.S. PATENT DOCUMENTS

| | | | |
|---|---|---|---|
| 4,581,319 | 4/1986 | Wieder et al. | 437/31 |
| 4,689,872 | 9/1987 | Appels et al. | 437/228 |
| 4,772,566 | 9/1988 | Zdebel et al. | 437/32 |
| 4,780,427 | 10/1988 | Sakai et al. | 437/33 |

FOREIGN PATENT DOCUMENTS

| | | | |
|---|---|---|---|
| 60-81862 | 5/1985 | Japan | 437/150 |
| 63-111667 | 5/1988 | Japan . | |
| 1-28959 | 1/1989 | Japan | 437/31 |
| 1-59955 | 3/1989 | Japan | 437/31 |

OTHER PUBLICATIONS

Gomi, T. et al.; "A Sub-30 Psec Si Bipolar LSI Technology," *IEEE IEDM Tech. Digest*, 1988, pp. 744-747.

Primary Examiner—Brian E. Hearn
Assistant Examiner—T. N. Quach
Attorney, Agent, or Firm—Steve R. Biren; Bernard Tiegerman

[57] ABSTRACT

A first device region (20) of one conductivity type is provided adjacent one major surface (11) of a semiconductor body (10). A layer (30) doped with impurities of the opposite conductivity type is provided on the one major surface (11) for forming an extrinsic subsidiary region (41) of a second device region (40) of the opposite conductivity type. An opening (31) is formed through the doped layer (30). Impurities for forming a coupling region (43) of the opposite conductivity type are introduced through the opening (31) prior to defining an insulating first portion (50) on the side wall (32) of the doped layer (30) to form a first window (80). Impurities for forming an intrinsic subsidiary region (42) of the second device region (40) are introduced through the first window (80). A second portion (60) is then defined on the insulating first portion (50) to form a smaller second window (90), and impurities for forming a third device region (70) through the second window (90) so that the extrinsic subsidiary region (41) and third device region are well spaced whilst the coupling region (43) enables good connection between the extrinsic and intrinsic subsidiary regions (41 and 42).

9 Claims, 3 Drawing Sheets

METHOD OF MANUFACTURING A BIPOLAR TRANSISTOR

DESCRIPTION

This invention relates to a method of manufacturing a semiconductor device such as, for example, a bipolar transistor.

U.S. Pat. No. 4,772,566 discloses a method of manufacturing a semiconductor device, which method comprises providing a semiconductor body having adjacent one major surface a first device region of one conductivity type, providing on the one major surface a layer doped with impurities for forming an extrinsic subsidiary region of a second device region of opposite conductivity type within the first device region, forming an opening through the doped layer, defining a first portion of an insulating material on the side wall of the doped layer bounding the opening and a second portion of a different material on the first portion, and introducing through the opening impurities for forming an intrinsic subsidiary region of the opposite conductivity type second device region within the first device region and a third device region of the one conductivity type within the intrinsic subsidiary region.

The method described in U.S. Pat. No. 4,772,566 relates to the manufacture of a bipolar transistor in which the first device region comprises the collector region of the transistor and in which the second and third device regions form the base and emitter regions, respectively.

It should be understood that as used herein the term 'intrinsic subsidiary region' refers to the active area of the second device region, that is in the case of the bipolar transistor described in U.S. Pat. No. 4,772,566 the active base region, whilst the term 'extrinsic subsidiary region' refers to that area which contacts the 'intrinsic subsidiary region' to facilitate contact to the second device region.

As described in U.S. Pat. No. 4,772,566, the doped layer is provided as a doped polycrystalline layer, for example a doped polycrystalline silicon layer. After definition of the polycrystalline layer to form the opening through which the impurities are to be introduced to form the intrinsic base and the emitter regions and to form a collector contact opening, a thin thermal oxide layer is grown on the polycrystalline layer. With the base and emitter opening masked, impurities are introduced to form a highly doped collector contact region. After formation of the highly doped collector contact region, this opening is masked and impurities for forming the intrinsic base region are then implanted. A conformal dielectric, for example silicon dioxide, layer is then deposited and covered by a polycrystalline layer, again this may be a polycrystalline silicon layer. The polycrystalline layer is then anisotropically etched to define the second portion and the dielectric layer then etched, using the polycrystalline second portion as a mask, to define the insulating first portion. A polycrystalline silicon layer is then deposited and doped with impurities of the one conductivity type which are subsequently caused to diffuse into the underlying semiconductor body to form the emitter region.

The method described in U.S. Pat. No. 4,772,566 employs a composite insulating spacer formed by the first and second portions which enables good separation of the emitter region and extrinsic base region to avoid hot carrier effects which could result in low emitter-base breakdown voltages. Also, the loss of dopant into the polycrystalline silicon reduces the geometry dependence of the transistor parameters. However, the etching of the composite spacer needs to be carried out with a process which enables the first and second portions to be etched with a high selectivity relative to the semiconductor body because otherwise a proportion of the impurities introduced for forming the intrinsic subsidiary region will be lost during the etching process. Anisotropic etching processes enable good control of the formation of the first and second portions but do not provide very high selectivity whilst wet etching processes although enabling high selectivity may result in underetching of the second portion so that the dimensions are not so well controlled.

SUMMARY OF THE INVENTION

It is an object of the present invention to provide a method of manufacturing a semiconductor device in which the separation or offset of the intrinsic subsidiary region and the third device region is well controlled to assist in avoiding hot carrier effects and to reduce, in the case of a bipolar transistor, the dependence of current amplification on the width, that is by convention the dimension of the emitter region measured in a direction parallel to the one major surface, of the emitter region.

According to the present invention there is provided a method of manufacturing a semiconductor device, which method comprises providing a semiconductor body having adjacent one major surface a first device region of one conductivity type, providing on the one major surface a layer doped with impurities for forming an extrinsic subsidiary region of a second device region of the opposite conductivity type within the first device region, forming an opening through the doped layer, defining a first portion of an insulating material on the side wall of the doped layer bounding the opening and a second portion of a different material on the insulating first portion, and introducing through the opening impurities for forming an intrinsic subsidiary region of the opposite conductivity type second device region within the first device region and a third device region of the one conductivity type within the intrinsic subsidiary region, characterised by introducing impurities for forming a coupling region of the opposite conductivity type through the opening prior to defining the insulating first portion on the side wall of the doped layer to form a first window, introducing the impurities for forming the intrinsic subsidiary region of the second device region through the first window, defining the second portion on the insulating first portion to form a smaller second window, and introducing the impurities for forming the third device region through the second window.

Thus, using a method in accordance with the invention, the impurities for forming the intrinsic subsidiary region, for example the intrinsic base region of a bipolar transistor, are introduced via a first window defined by the insulating first portion whilst the impurities for forming the third device region (which will form the emitter region in the case of a bipolar transistor) are introduced via a second smaller window defined by the different material second portion enabling the third device region to be well spaced from the extrinsic subsidiary region so as to inhibit hot carrier effects. In addition, before defining the insulating first portion, impurities are introduced through the opening for forming a coupling region of the opposite conductivity type for ensuring connection of the extrinsic and intrinsic subsidiary regions. This coupling region enables the extrinsic subsidiary region and the third device region to be well spaced so as to inhibit edge effects and leakage currents to avoid or at least inhibit possible punch-through between the first and third device regions. Generally, the impurities for forming the coupling region are implanted using a dose and energy such that the coupling region is more shallow and lowly doped than the intrinsic subsidiary region of the second device region so that any variations in the definition of the first and second portions do not significantly affect the width (that is by convention the depth into the semiconductor body where the intrinsic subsidiary region of the intrinsic base region of a bipolar transistor) of the intrinsic subsidiary region of the second device region.

The insulating first portion may be provided by anisotropically etching an insulating first layer provided over the opening and the second portion by anisotropically etching a second layer of a material different from the first insulating layer provided over the first window selectively with respect to the insulating first region. The second portion may also be an insulating portion. The insulating first portion may be defined by depositing an oxide, for example a silicon oxide, layer over the doped layer and then anisotropically etching the oxide layer to leave the insulating first portion whilst the second portion may be defined by depositing a polycrystalline, for example a polycrystalline silicon, layer over the doped layer and then anisotropically etching the polycrystalline layer to leave the second portion. A further insulating layer, for example a silicon oxide layer, may be provided over the first window prior to the second layer so facilitating etching of the second portion and enabling the second portion, when defined, to be spaced from the surface of the semiconductor body exposed in the opening by the further insulating layer. With such a method, the width, that is the depth into the semiconductor body, of the intrinsic subsidiary region, the intrinsic base region in the case of a bipolar transistor, is less sensitive to variations in the etching of the insulating material forming the insulating first portion. In addition, especially in the case of a bipolar transistor, the control of the separation of the intrinsic base and emitter regions which this allows enables the current amplification to be much less dependent on the width (that is the dimension along the one major surface) of the emitter region so that the current amplification is not significantly degraded by reduction in the device dimensions.

BRIEF DESCRIPTION OF THE DRAWINGS

Embodiments of the invention will now be described, by way of example, with reference to the accompanying drawings, in which.

Figure 1:
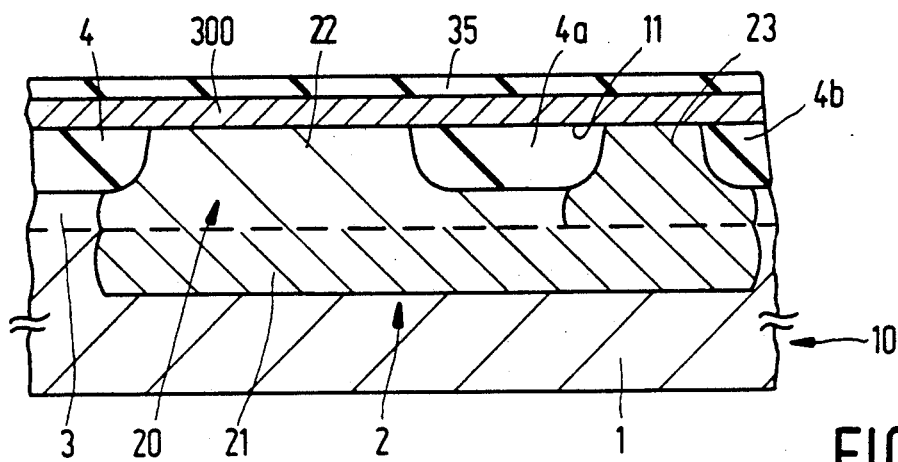
FIGS. 1 and 2 are cross-sectional views of part of a semiconductor body for illustrating steps in a method in accordance with the invention for manufacturing a bipolar transistor.

It should, of course, be understood that the Figures are merely schematic and are not drawn to scale various dimensions, such as the thickness of layers, having been exaggerated relative to other dimensions in the interests of clarity.

DESCRIPTION OF THE PREFERRED EMBODIMENT

Referring now to the drawings, there is illustrated a method of manufacturing a semiconductor device, which method comprises providing a semiconductor body 10 having adjacent one major surface 11 a first device region 20 of one conductivity type, providing on the one major surface 11 a layer 30 doped with impurities for forming an extrinsic subsidiary region 41 of a second device region 40 of the opposite conductivity type (FIG. 8) within the first device region 20, forming an opening 31 through the doped layer 30, defining a first portion 50 of an insulating material on the side wall 32 of the doped layer 30 bounding the opening 31 and a second portion 60 of a different material on the first portion 60, and introducing through the opening 31 impurities for forming an intrinsic subsidiary region 42 of the opposite conductivity type second device region 40 within the first device region 20 and a third device region 70 of the one conductivity type within the intrinsic subsidiary region 42.

In accordance with the invention the method comprises introducing impurities for forming a coupling subsidiary region 43 of the opposite conductivity type through the opening prior to defining the insulating first portion 50 on the side wall 32 of the doped layer 30 to form a first window 80, introducing the impurities for forming the intrinsic subsidiary region 42 of the second device region 40 through the first window 80, defining the second portion 60 on the insulating first portion 50 to form a smaller second window 90, and introducing the impurities for forming the third device region 70 through the second window 90.

Turning now to the specific example shown in the drawings, there is illustrated a method in accordance with the invention of manufacturing a bipolar transistor which may be suitable for integration within a BiCMOS process, that is a process in which complementary n- and p- channel insulated gate field effect transistors (IGFETs) are formed together with bipolar transistors in the same semiconductor body or may be used in a purely bipolar process.

In the example to be described below, the semiconductor body 10 comprises a monocrystalline silicon substrate 1 of the opposite conductivity type, in this case p- conductivity type, with a resistivity of, typically, 10 ohm-cm into which impurities of the one conductivity type (n- conductivity type in this example) are introduced using an appropriate mask to form at a device area 2 a highly doped region 21 which will later form part of the collector region 20 of the bipolar transistor. A layer 3 (indicated by dashed lines in the Figures) of p- conductivity type silicon with a resistivity of, typically, 8 to 12 ohm-cm is epitaxially grown on the substrate 1, thereby burying the highly doped region 21.

Using conventional photolithographic and etching techniques a mask layer (not shown) is then defined and impurities are introduced, in this case phosphorus ions are implanted, to form an n conductivity type region 22 directly above and contacting the buried region 21. The region 22 forms the main subsidiary region of the collector region 20.

The device area 2 is then defined or separated from other device areas (not shown) of the semiconductor body 10 by forming field oxide regions 4 using, for example, conventional local oxidation of silicon techniques with a silicon oxide-silicon nitride anti-oxidation mask (not shown).

At this stage various threshold adjustment implantations may be carried out if necessary. Also, although not shown, highly conductive channel stopper regions may be formed by ion implantation beneath the field oxide regions 4. As shown in FIG. 1, in addition to defining the device area 2, the field oxide regions 4a, 4b serve to define a collector contact area 23 which is doped twice with impurities of the one conductivity type, once during formation of the main subsidiary region 22 of the collector region 20 and then again through an appropriate mask to form a highly doped contact region to enable ohmic contact to the collector region 20.

A dopable layer 300, usually a semiconductor layer and, in this example a polycrystalline silicon layer, is then deposited using conventional low pressure chemical vapour deposition techniques (LPCVD). P conductivity type, in this example boron ions, are then implanted into the polycrystalline silicon over the device area 2.

An insulating layer 35, for example a layer of silicon dioxide, is then deposited over the device area 2.

Figure 2:
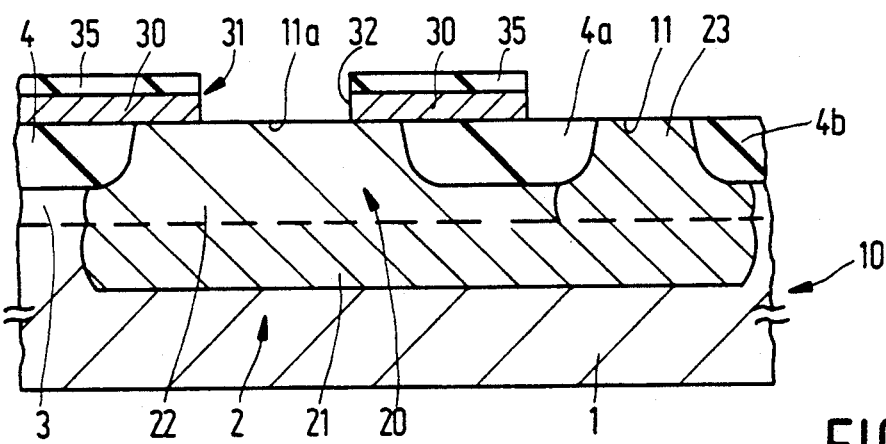

A conventional mask (not shown) is then defined over the insulating layer 35 and the insulating layer 35 and the doped polycrystalline silicon layer are then patterned using conventional techniques to define the doped layer 30 and to form the opening 31 thereby producing the structure shown in FIG. 2.

P conductivity type ions, in this example boron ions, are then implanted using a low dose and energy for forming the coupling region 43 of the second region 40. The coupling region 43 is a shallow region and, typically, boron (B+) ions with an energy of about 10 keV (kilo-electron volts) and a dose of in the range of from about $10^{12}$ to about $10^{13}$ ions cm$^{-2}$ are used. The purpose of this shallow coupling region 43 will be explained below.

Figure 3:
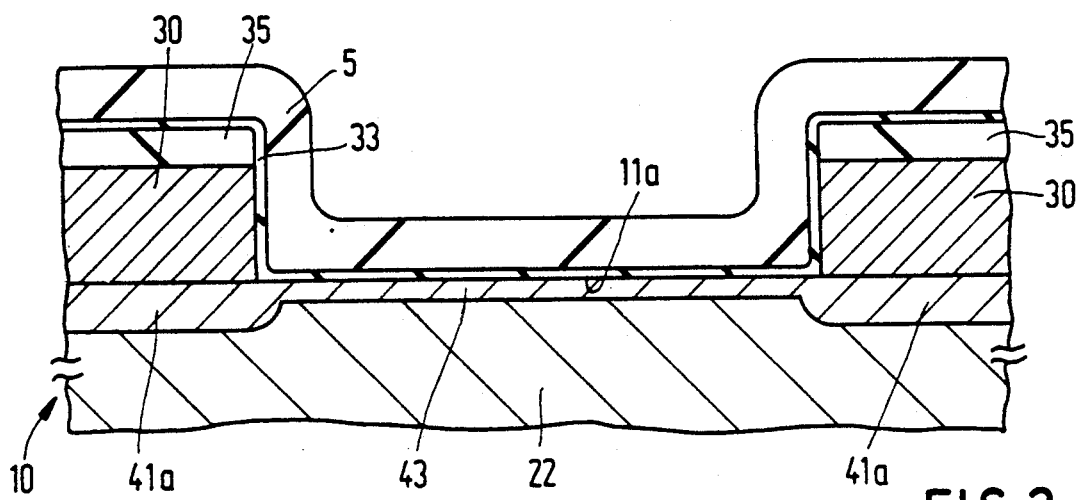
FIGS. 3 to 7 are enlarged cross-sectional views of a portion of the semiconductor body shown in FIGS. 1 and 2 for illustrating further steps of a method in accordance with the invention for manufacturing a bipolar transistor.
Figure 4:
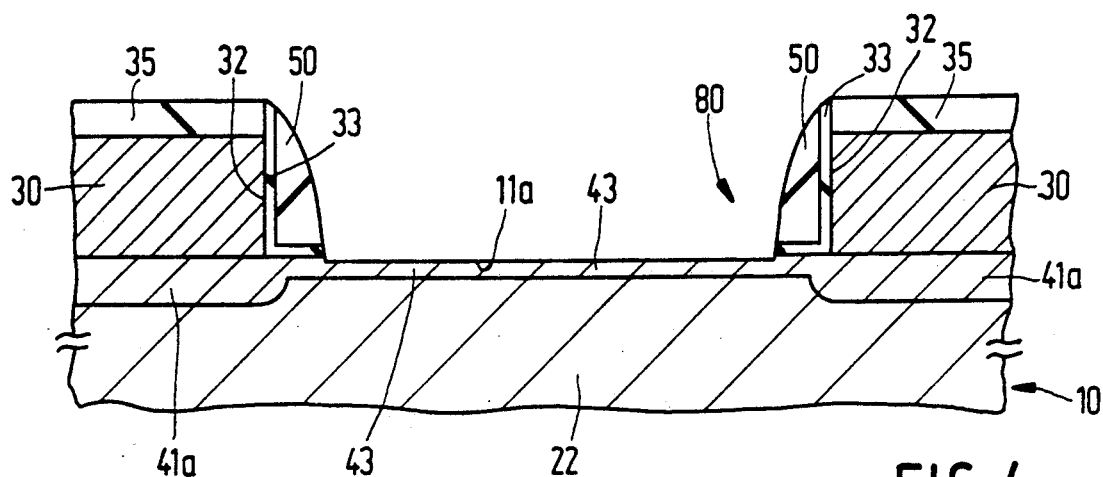

After patterning of the insulating layer 35 and the doped layer 30 a thin thermal oxide layer 33 is grown on the exposed silicon surface regions. An insulating layer 5, in this example a layer of tetra-ethyl-ortho-silicate (TEOS), is then deposited over the structure as shown in FIG. 3. By this stage in the process there may have been a certain amount of diffusion of boron ions out of the doped layer 30 into the semiconductor body 1 forming a precursor region 41a which will eventually provide the extrinsic region 41 of the second region 40. The insulating layer 5 is then etched anisotropically using conventional plasma etching (e.g. a $CF_4$ or $CHF_3+O_2$ plasma) techniques to leave the insulating first portion 50 or spacer 50 on the side wall 32 of the doped layer 30 bounding the opening 31 as shown in FIG. 4. If the desired width of the third device or emitter region 70 is about 0.4 μm (micrometers) and the opening 31 is about 1.0 μm, then the thickness of the insulating layer 50 will be selected such that the insulating first portion or spacer 50 is about 0.2 μm wide (or thick) at its widest point, that is adjacent the exposed surface area 11a.

During the anisotropic etching to form the first insulating portion 50, a small amount of the exposed surface area 11a of the semiconductor body 1, will be lost or removed and some or possibly even all of the boron ions for forming the shallow subsidiary region 43 implanted at this exposed surface area 11a will be lost or removed. A small amount of the boron ions may however remain.

Figure 5:
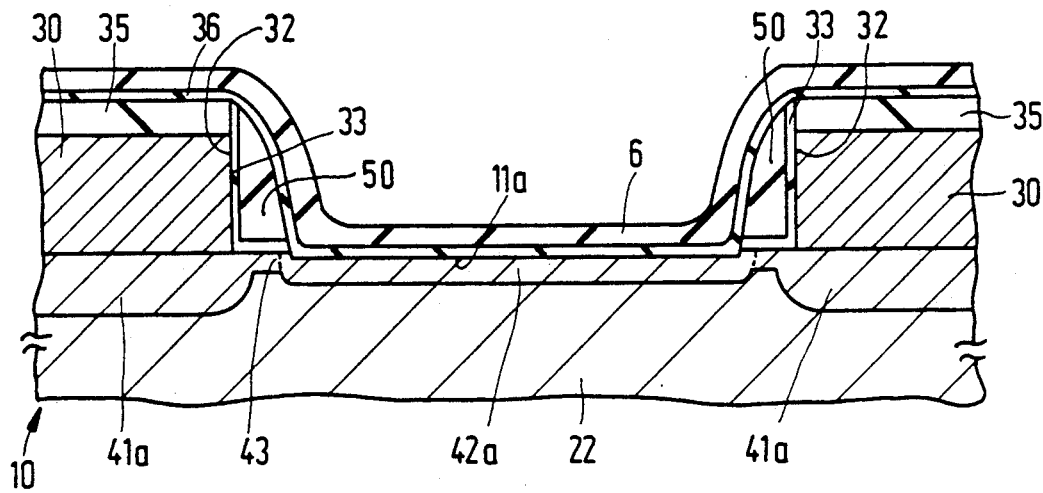

After formation of the insulating first portion 50 as shown in FIG. 4, a thin further insulating layer 36, for example a thermal oxide layer with a thickness of about 25 nm (nanometers), is deposited over the surface and, in this example, p conductivity type impurities are introduced to provide, as shown in FIG. 5, a precursor region 42a for eventually forming the intrinsic subsidiary region 42 which will in this example, form the intrinsic base region of the bipolar transistor. A conventional masking layer (not shown) is used to mask the collector contact region 23 from this implantation. In the example being described, the p conductivity type impurities are introduced by implanting boron (B+) ions with an energy of about 35 keV and a dose of in the range of about 2 to $5 \times 10^{13}$ ions cm$^{-2}$. As an alternative, the p conductivity type impurities for forming the precursor region 42a may be introduced prior to forming the further insulating layer 36. In this case, the further insulating layer 36 may be a deposited layer, for example a TEOS layer.

A layer 6 of undoped (that is not intentionally doped) polycrystalline material, in this example a layer of undoped polycrystalline silicon of about 0.15 μm thickness, is then deposited, using conventional low pressure chemical vapour deposition techniques, over the thin further insulating layer 36.

Figure 6:
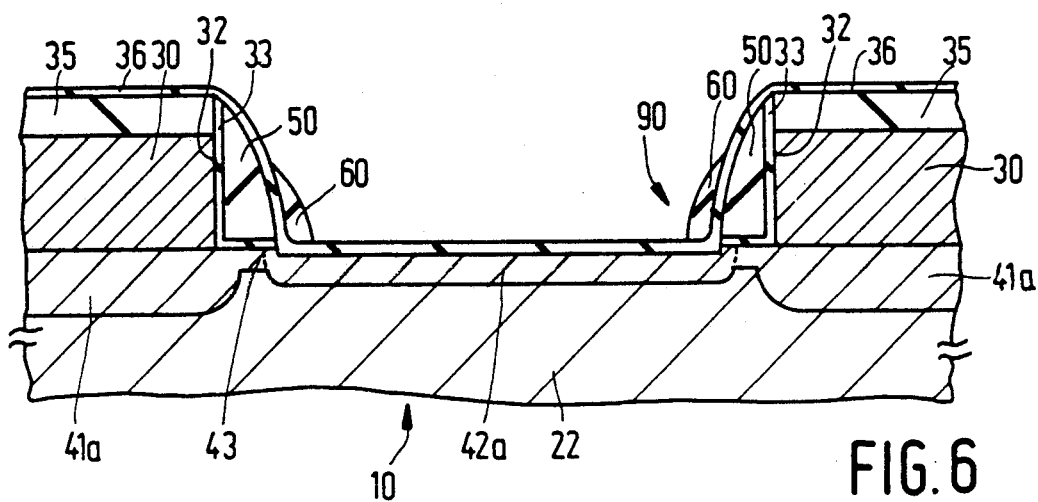

The polycrystalline silicon layer 6 is then etched using an anisotropic process, for example a chlorine plasma etching process, which etches polycrystalline silicon with high selectivity with respect to insulating material such as, in this example, a thermal oxide or TEOS. This anisotropic etching of the undoped polycrystalline silicon layer 6 results in a small, for example 0.1 μm for the emitter dimensions given above, undoped polycrystalline silicon spacer which forms the second portion 60 on the first portion 50 as shown in FIG. 6.

The thin further insulating layer 36 masks the semiconductor surface region 11a from the etchant used to etch the polycrystalline silicon layer 6 enabling the polycrystalline silicon layer 6 to be etched with high selectivity whilst avoiding erosion by the etchant of the silicon surface region 11a. This means that the width, that is by convention the depth into the semiconductor body, of the intrinsic base region 42 is less sensitive to the etching processes used to form the first and second portions 50 and 60. Also, the remaining portion of the insulating layer 36 provides a barrier beneath the polycrystalline silicon second portion 60 to prevent diffusion of the p type impurities out of the semiconductor body into the polycrystalline silicon second portion 60.

The undoped polycrystalline silicon second insulating portion 60 thus defines the second smaller window 90 through which n-conductivity type impurities may be introduced to form the third device, in this case the emitter, region 70.

The thin further insulating layer 36 covering the surface area 11a is then removed leaving only the portion 36a beneath the polycrystalline silicon second insulating portion 60. The thin further insulating 36 can be etched with a high selectivity relative to the silicon surface region 11a, for example by using a plasma etching process such as that used to form the first portion 50, so that erosion of the surface region 11a and thus loss of impurities introduced to form the intrinsic subsidiary region 42 is avoided or at least reduced.

Figure 7:
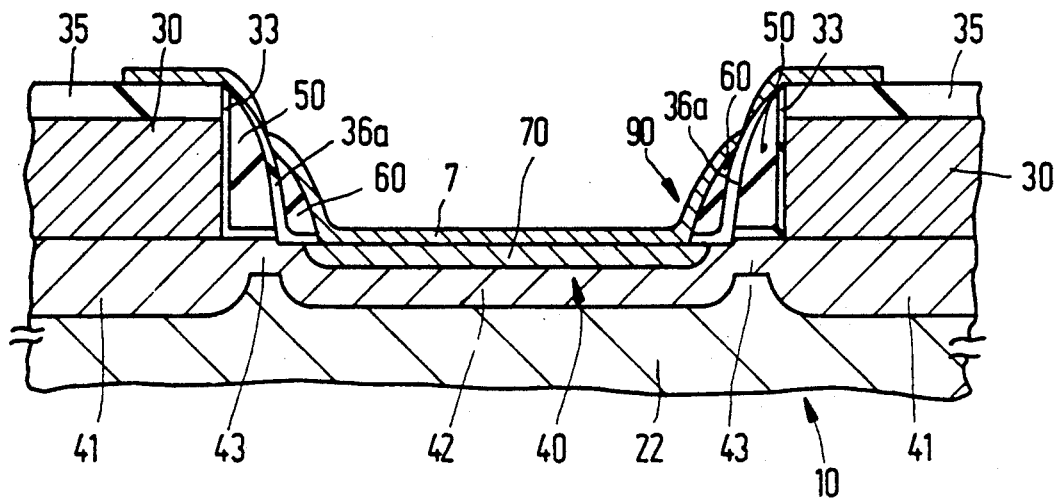

A dopable layer 7, in this example another layer of polycrystalline silicon with a thickness of about 150 nm, is then deposited by conventional LPCVD techniques in the second smaller window 90 and doped with n conductivity type impurities, in this case by implantation of arsenic (As+) ions with a dose of about $7.5 \times 10^{15}$ ions cm$^{-2}$ at an energy of about 75 keV. After patterning of the doped polycrystalline silicon layer 7 using conventional photolithographic and etching technique to leave the layer 7 only covering the desired area as shown in FIG. 7, the semiconductor body is heated, for example to about 925° C. (degrees Celsius) for about 60 minutes in a nitrogen atmosphere, to cause n conductivity type impurities to diffuse out of the doped layer 7 into the semiconductor body 1 to form the third, that is in this example the emitter, region 70. This heating treatment also drives in the previously introduced impurities so as to form the extrinsic and intrinsic subsidiary regions 41 and 42 of the second device, that is in this example the base, region 40. Alternatively, instead of forming the emitter region 70 by causing impurities to diffuse out of a doped layer, the impurities for forming the emitter region 70 could simply by implanted.

The remaining portion of the thin further insulating layer 36a beneath the polycrystalline silicon second portion 60 serves to prevent or inhibit impurities in the doped layer 7 (or impurities being implanted to form the emitter region 70) passing through the second portion 60 into the semiconductor body 1.

The shallow coupling region 43 is more shallow and lowly doped than the intrinsic subsidiary region 42 and is overdoped by the n conductivity type impurities introduced for forming the emitter region 70. However, outside the area of the emitter region 70, the coupling region 43 serves to ensure that there is a good low resistance coupling between the extrinsic and intrinsic subsidiary regions 41 and 42. The coupling region 43 thus enables the extrinsic subsidiary region 41 to be well spaced from the emitter region 70 so as to reduce leakage currents and the possibility of parasitic bipolar action whilst avoiding or at least inhibiting the possibility of punch-through between the emitter and collector regions 70 and 20.

Figure 8:
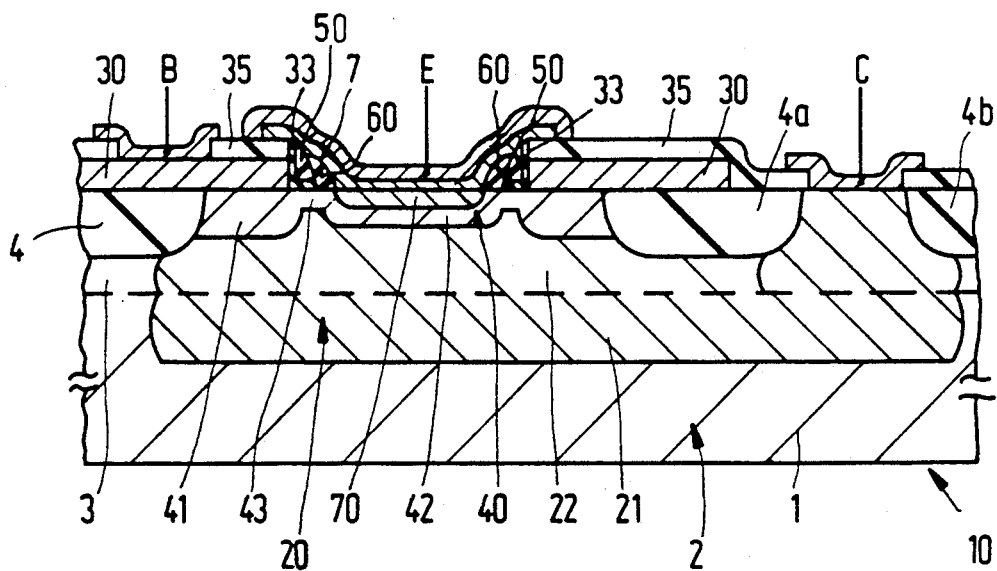
FIG. 8 is a cross-sectional view showing a bipolar transistor manufactured using a method in accordance with the invention.

After formation of the emitter region 70 as shown in FIG. 7, a further masking layer (not shown) is applied to allow the opening of contact holes for enabling a first level of metallisation, for example a layer of titanium-tungsten alloy followed by a layer of silicon-containing aluminum, to be deposited and patterned by conventional techniques to form collector, base and emitter contact electrodes C, B and E as shown in FIG. 8. In order to improve ohmic contact to the electrodes, a silicide, for example a cobalt or titanium silicide, layer may be formed in conventional self-aligned manner on the exposed silicon surfaces before deposition of the metallisation.

In the method described above, the impurities for forming the intrinsic base region 42 are introduced through the first window 80 defined by the insulating first portion 50 whilst the impurities for forming the emitter region are introduced through the second smaller window 90 defined by the second portion 60 which is formed by an etching process which is selective with respect to the insulating first portion 50. This enables the emitter region 70 to be well spaced from the extrinsic base region 41 so as to inhibit hot carrier effects. Also, as the second portion 60 is defined more independently of the insulating first portion 50, the width (that is, by convention, the depth into the semiconductor body in the case of the intrinsic base region of a bipolar transistor) of the intrinsic subsidiary region 42 can be controlled more accurately and is less susceptible to over-etching of the oxide forming the insulating first portion 50. In addition, especially in the case of a bipolar transistor, the control of the separation of the intrinsic base and emitter regions which this allows enables the current amplification (hfe) to be much less dependent on the width (that is, by convention, the dimension parallel to the one major surface 11) of the emitter region so that the current amplification is not significantly degraded by reduction in the device dimensions. In particular, the inventors have found that, using the method described above, a bipolar transistor having a measured emitter width of about 0.4 μm has a current amplification which is not significantly degraded with respect to that of a bipolar transistor having an emitter width of about 10 μm manufactured using the same method.

Although in the method described above, the first and second portions 50 and 60 are formed of silicon oxide (TEOS) and undoped polycrystalline silicon (which in the present context is considered to be insulating), respectively, other materials could be used, provided that the material used to form the second portion 60 can be etched selectively with respect to the material of the insulating first portion 50. Thus, for example, the first portion 50 may be a silicon oxide portion whilst the second portion 60 is a silicon nitride portion. If a material is available for forming the second portion 60 which can be easily etched with high selectivity relative to the first portion 50 and the semiconductor body then the further insulating layer 36 could, if desired, be omitted. Where the further insulating layer 36 is present, as in the example described above, beneath the second portion 60, the second portion 60 may be formed of a semiconductor or even conductive material, for example a doped polycrystalline silicon. Also, dopable materials other than polycrystalline silicon, for example amorphous silicon, may be used for the doped layer 31 and layer 7.

In addition, a method embodying the invention may be applied to bipolar transistors which are not symmetrical about the emitter region 70, that is, for example, where the base contact B is provided on only one side of the emitter region and to lateral bipolar transistors in addition to the vertical type of bipolar transistor shown in FIG. 8. Also, a method embodying the invention may be applied to other types of semiconductor devices.

Of course, the conductivity types given above could be reversed and a method embodying the invention may be applied where the semiconductor body 1 is formed of a material other than silicon, for example a III-V material such as gallium arsenside.

From reading the present disclosure, other modifications or variations will be apparent to persons skilled in the art. Such modifications or variations may involve other features which are already known in the semiconductor art and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any any generalisation or modification of one or more of those features, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device, which method comprises providing a semiconductor body having adjacent one major surface a first device region of one conductivity type, providing on the one major surface a layer doped with impurities for forming an extrinsic subsidiary region of a second device region of the opposite conductivity type within the first device region, forming an opening through the doped layer, defining a first portion of an insulating material on the side wall of the doped layer bounding the opening and a second portion of a different material on the first portion, and introducing through the opening impurities for forming an intrinsic subsidiary region of the opposite conductivity type second device region within the first device region and a third device region of the one conductivity type within the intrinsic subsidiary region, characterised by introducing impurities for forming a coupling region of the opposite conductivity type through the opening prior to defining the insulating first portion on the side wall of the doped layer to form a first window, introducing the impurities for forming the intrinsic subsidiary region of the second device region through the first window, defining the second portion on the insulating first portion to form a smaller second window, and introducing the impurities for forming the third device region through the second window.

2. A method according to claim 1, further characterised by implanting the impurities for forming the coupling region using a dose and energy such that the coupling region is more shallow and lowly doped than the intrinsic subsidiary region of the second device region.

3. A method according to claim 2, further characterised by defining the insulating first portion by anisotropically etching an insulating first layer provided over the opening and by defining the second portion by anisotropically etching a second layer of a material different from the insulating first layer provided over the first window selectively with respect to the insulating first region.

4. A method according to claim 1, further characterised by defining the insulating first portion by anisotropically etching an insulating first layer provided over the opening and by defining the second portion by anisotropically etching a second layer of a material different from the insulating first layer provided over the first window selectively with respect to the insulating first region.

5. A method according to claim 4, further characterised by providing a further insulating layer over the first window prior to the second layer and anisotropically etching the second layer selectively with respect to the further insulating layer.

6. A method according to claim 1, further characterised by providing the second portion as an insulating material portion.

7. A method according to claim 1, further characterised by providing the first and second portions as portions of silicon oxide and polycrystalline silicon, respectively.

8. A method according to claim 1, further characterised by introducing the impurities to form the third device region by providing a layer doped with impurities of the one conductivity type in the second window.

9. A method according to claim 1, further characterised by defining the first, second and third device regions as the collector, base and emitter regions, respectively, of a bipolar transistor.

* * * * *